United States Patent [19]
Chibana

[11] 3,870,970
[45] Mar. 11, 1975

[54] FREQUENCY DIVIDING CIRCUIT

[75] Inventor: Masanobu Chibana, Hamamatsu, Japan

[73] Assignee: Nippon Gakki Seizo Kabushiki Kaisha, Hamamatsu-shi, Shizuoka-ken, Japan

[22] Filed: Jan. 28, 1974

[21] Appl. No.: 437,200

[30] Foreign Application Priority Data

Jan. 26, 1973 Japan ............................... 48-10276

[52] U.S. Cl. ....................... 331/25, 328/43, 328/155
[51] Int. Cl. ............................................. H03b 3/04
[58] Field of Search ........... 328/39, 41, 43, 48, 155; 331/25

[56] References Cited

UNITED STATES PATENTS

| | | | |
|---|---|---|---|
| 3,401,353 | 9/1968 | Hughes | 331/25 X |
| 3,458,823 | 7/1969 | Nordahl | 328/155 |
| 3,504,290 | 3/1970 | Earle | 328/48 X |
| 3,729,688 | 4/1973 | Cerny et al. | 331/25 X |
| 3,731,219 | 5/1973 | Mader et al. | 331/25 X |
| 3,805,192 | 4/1974 | Ocnaschek et al. | 331/25 X |

*Primary Examiner*—John S. Heyman
*Attorney, Agent, or Firm*—Robert E. Burns; Emmanuel J. Lobato; Bruce L. Adams

[57] ABSTRACT

A waveform memory memorises a particular desired waveform as a sampled values at dotted time points.

A ring counter driven by a voltage controlled oscillator reads the waveform memory to produce the memorized waveform signal. Ring counter cycle frequency fx is divided into fx/2n. An input signal frequency fi is divided into fi/2m. These fx/2n and fi/2m are compared with each other by a phase difference detector, whose output is applied back to the voltage controlled oscillator to bring the oscillator frequency to such a value that fx/2n = Fi/2m, i.e. fx = (n/m) fi.

In this way, an output signal of a desired waveform and having a frequency fx which is of a ratio of any rational number n/m to the input signal frequency fi can be obtained.

3 Claims, 4 Drawing Figures

FREQUENCY DIVIDING CIRCUIT

BACKGROUND OF THE INVENTION

This invention relates generally to frequency dividing circuits and more particularly to a type thereof which is adapted for use in generating a desired tone-color waveform in an electronic musical instrument.

Known is a tone-colar waveform generating circuit comprising a square wave oscillator driven by a master oscillator and a plurality of filters through which the square waves obtained from the square wave oscillator are passed, and the frequencies thus obtained are combined for producing tone-color waveforms.

However, this conventional tone-color waveform generating circuit necessitates a large number of filters, whereby there has been a certain limitation in miniaturization of the tone-color waveform generating circuit, and techniques such as incorporation into an integrated circuit cannot be resorted to. Furthermore, mixing circuits for combining the outputs from the filters into desired tone-color waveforms must have mutually different circuit organizations for different tone-colors, whereby it is necessary to use separate parts for different color-tone waveforms. As a result, complication of production control of the tone-color waveform generating circuit heretofore could not be avoided.

For overcoming the above described difficulties of the conventional waveform generating circuit, a frequency dividing circuit as shown in FIG. 1, which will be described hereinlater in more detail, has been proposed. In this frequency dividing circuit, a sinusoidal input signal is applied to a clipper so that the waveform thereof is converted, and a train of pulses thus shaped are thereafter applied to a frequency divider of a predetermined frequency dividing ratio.

The output pulses of a frequency thus divided are thereafter applied to a ring-counter, a required number of stages of which have been connected to a wave-memory through a corresponding number of lead wires.

The wave-memory is so constituted and adapted that it memorizes, for instance, voltages of a number corresponding to that of the lead wires, whereby when the output pulses from the ring-counter arrive through the lead wires at the wave-memory, the voltages memorized in the wave-memory are delivered sequentially through a smoothing low-pass filter to an output terminal of the frequency dividing circuit.

The voltages memorized in the wave-memory have been chosen beforehand at values representing amplitudes at sampled instants of a tone-color waveform, the number of the sampled instants being equal to that of the lead wires. As a result, a tone-color waveform memorized in the wave-memory is delivered repeatedly from the output terminal of the frequency dividing circuit with a repetition frequency determined by the frequency of the original pulses, the frequency dividing ratio of the frequency divider, and the number of stages chosen in the ring counter.

The frequency divider described above has ordinarily comprised a plurality of flip-flops connected in series, and hence the frequency dividing ratio thereof is inevitably an integer. For this reason, it has been impossible to select the frequency dividing ratio of the entire frequency dividing circuit at an arbitrary rational number. Of course, the above described frequency divider may be theoretically replaced by a type having a frequency dividing ratio which is not an integer. However, the organization of such a type of frequency divider is excessively complicated, and the frequency dividing ratio once set in the frequency divider cannot be readily changed thereafter. In other words, there has been practically no frequency divider which is of such simple organization that it can be used in the tone-color waveform generating circuit in an electronic musical instrument.

SUMMARY OF THE INVENTION

With the above noted difficulties of the conventional frequency dividers in view, a primary object of the present invention is to provide a novel frequency dividing circuit which is simple in organization and economical in production.

Another object of the invention is to provide a novel frequency dividing circuit whose frequency dividing ratio can be chosen at an arbitrary rational number inclusive of an integer.

Still another object of the invention is to provide a novel frequency dividing circuit wherein the variation of the frequency dividing ratio is extremely easy.

A further object of the invention is to provide a novel frequency dividing circuit whose output waveform can be freely selected over a wide range.

These and other objects of the present invention can be achieved by a novel frequency dividing circuit comprising a counter, a waveform memory from which a waveform memorized therein can be read out sequentially upon reception of a plurality of outputs from said counter, a $1/m$-frequency divider for dividing the frequency divider for dividing the frequency of an input signal into $1/m$, a $1/n$-frequency divider which divides the frequency of the output from said counter into $1/n$, a phase difference detector which delivers an output voltage when a phase difference exists between the outputs from said $1/m$ and $1/n$ frequency dividers, and a voltage controlled oscillator whose oscillation frequency is shifted in accordance with the output voltage from said phase difference detector, the output of said voltage controlled oscillator being applied to said counter, whereby the waveform memorized in the waveform memory is successively read out at a repetition frequency equal to a $m/n$-th fraction of the frequency of the input signal.

As a modification, the above described frequency dividing circuit may further comprise two 1/2-frequency dividers, one being interposed between said $1/m$-frequency divider and said phase difference detector and another interposed between said $1/n$-frequency divider and said phase-difference detector.

The nature, principle, and utility of the present invention will be more fully understood from in following detailed description of the invention when read together with the accompanying drawings.

DETAILED DESCRIPTION

Figure 1:
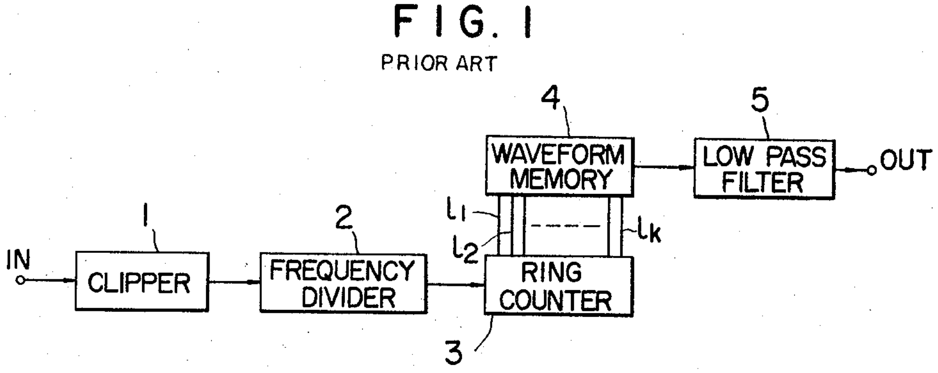
FIG. 1 PRIOR ART
FIG. 1 is a block diagram showing a frequency dividing circuit of a conventional organization.

As described hereinbefore, the frequency dividing circuit shown in FIG. 1 comprises a clipper 1 wherein a sinusoidal input signal is shaped into a pulse form, a frequency divider 2 wherein the repetition frequency of the output pulses delivered from the clipper 1 is divided with a predetermined ratio, a ring-counter 3 receiving pulses of the thus divided frequency, and a waveform memory 4 connected through lead wires $1_1$ through $1_k$ with the corresponding number of stages of the ring-counter 3.

Figure 2:
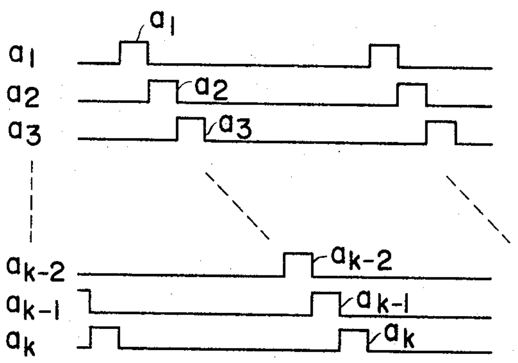
FIG. 2 PRIOR ART
FIG. 2 is a diagram showing output pulses from a counter in the circuit shown in FIG. 1.

In the waveform memory 4, for instance, voltages of a number equal to that of the lead wires $1_1$ through $1_k$ have been memorized, whereby when output pulses $a_1$ through $a_k$ as shown in FIG. 2, which are delivered from the ring-counter 3, arrive at the wave-memory 4 via the lead wires $1_1$ through $1_k$, the voltages thus memorized are read out sequentially through a smoothing low-pass filter 5 and an output terminal 6 of the frequency dividing circuit.

In the conventional frequency dividing circuit shown in FIG. 1, a tone-color waveform memorized in the wave-memory 4 is delivered repeatedly from the output terminal out of the frequency dividing circuit with the repetition frequency determined by the frequency of the original pulses, the frequency dividing ratio of the frequency divider, and the number of stages chosen in the ring-counter 3.

Since the frequency dividing ratio of the frequency divider 2 is inevitably an integer as mentioned hereinbefore, the frequency dividing ratio of the entire frequency dividing circuit cannot be a rational member.

Figure 3:
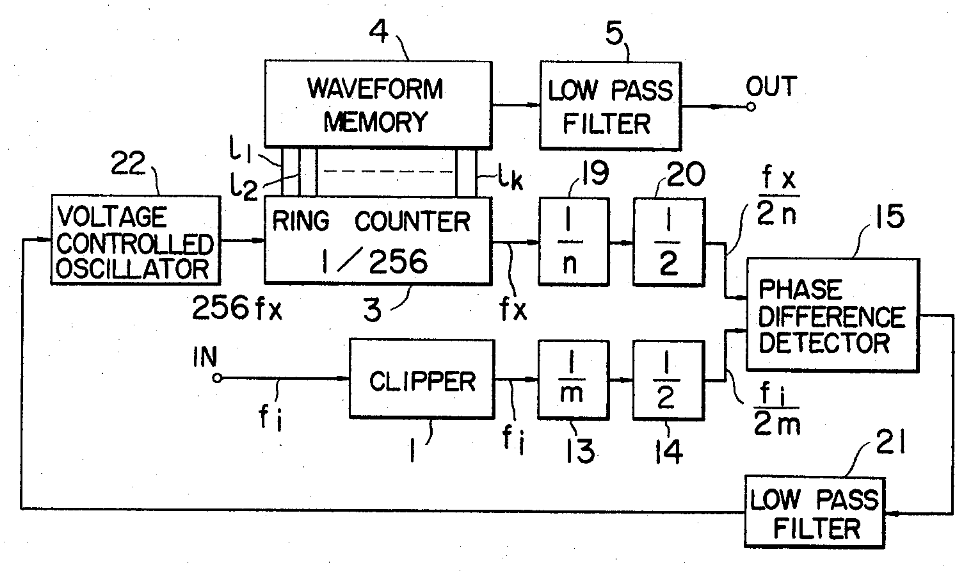
FIG. 3 is a block diagram showing an example of a frequency dividing circuit according to the present invention.

Referring now to FIG. 3, there is illustrated an example of a frequency dividing circuit according to the present invention.

An input signal of, for instance, simusoidal configuration and of a frequency *fi* is introduced through an input terminal IN of the frequency dividing circuit, and shaped into square wave pulses of the same frequency *fi* in a clipper 1. The frequency *fi* of the square wave pulses in successively divided in a $1/m$-frequency divider 13 and a 1/2-frequency divider 14, and the resultant square pulses of a frequency $fi/2m$ are applied to one input terminal of a phase-difference detector 15.

In the frequency dividing circuit according to the present invention, there are provided a ring-counter 3 of, for instance, 256 stages, a waveform memory 4, and a smoothing low-pass filter 5, all of similar arrangement as shown in FIG. 1, and the output from the counter 3 of a frequency *fx* is successively divided with respect to the frequency through a $1/n$-frequency divider 19 and a 1/2-frequency divider 20. The square wave pulses of a frequency $fx/2n$ thus obtained are thereafter applied to another input terminal of the phase-difference detector 15.

Whenever there is a phase difference between the two input pulses, the phase-difference detector 15 produces a d.c. voltage of a magnitude corresponding to the phase difference, and this voltage is applied to a voltage-controlled oscillator 22 through another smoothing low-pass filter 21.

The oscillation frequency of the voltage-controlled oscillator 22 is shifted (varied) in correspondence with the d.c. output voltage from the phase difference detector 15, and the output pulse train obtained from the oscillator 22 is applied to the input terminal of the ring-counter 3.

When the ring-counter 3 counts output pulses from the oscillator 22, output pulses $a_1, a_2, \ldots, a_k$ (similar to those in FIG. 2) are delivered through lead wires, $1_1$, $1_2$, $1_k$, interconnecting the ring-counter 3 and the waveform memory 4 as in the conventional frequency dividing circuit shown in FIG. 1, and voltages representing a memorized tone-color wave-form are successively read out from the waveform memory 4.

That is, each time the counter 16 has counted, for instance, 256 pulses, voltages representing one complete tone-color waveform are delivered from the output terminal OUT.

Figure 4:
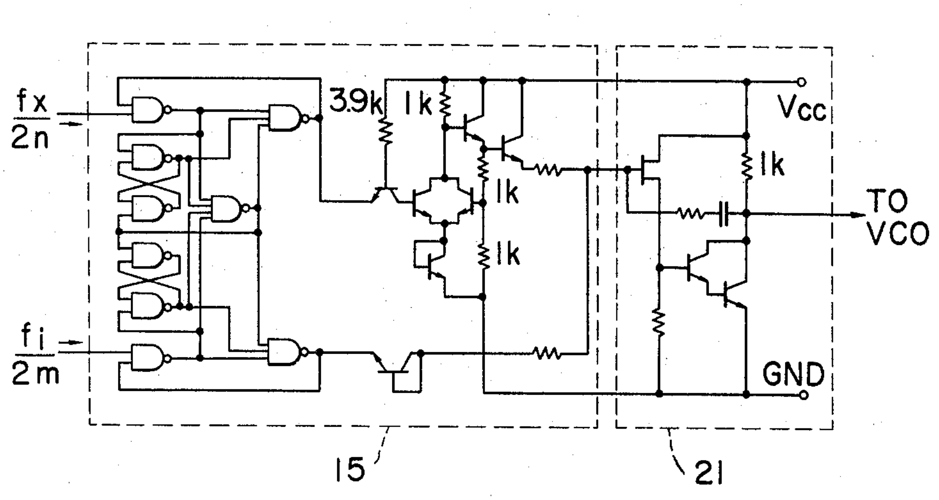
FIG. 4 is an actual detailed circuit diagram of a main portion of this invention.

On the other hand, a square pulse train of a pulse-frequency *fx*, which is equal to the repetition frequency of the tone-color waveform delivered from the output terminal OUT, is obtained from the output terminal of the ring-counter 2, and the frequency *fx* of the pulse train is divided as described before into a frequency $fx/2n$ through the frequency dividers 19 and 20. The resultant pulses of the frequency $fx/2n$ are then applied to one input terminal of the phase-difference detector 15, and the frequency $fx/2n$ is compared with the frequency $fi/2m$ of another square pulse train applied to the other input terminal of the phase difference detector 15. The output from the detector 15 is fed via a low pass filter 21 to the voltage controlled oscillator 22, thereby (together with the ring counter 3 and the frequency dividers 19 and 20) constituting a well known "phase locked loop"The actual construction of this phase locked loop portion is shown in FIG. 4. If a difference exists between the two frequencies, the oscillation frequency of the voltage-controlled oscillator 22 is varied in accordance with the difference amounts until the difference becomes zero.

The above described control of the oscillator 22 is repeated as long as a frequency difference exists between the two input pulses of the phase-difference detector 15, and ultimately the two frequencies $fi/2m$ and $fx/2n$ are equalized to be $$fi/2m = fx/2n \tag{1}$$

and the frequency fx can be expressed as $$fx = (n/m)fi \tag{2}$$

In other words, the repetition frequency *fx* of the tone-color waveform signals delivered from the output terminal OUT is equal to a value obtained by dividing the frequency fi of the original pulse train with a frequency dividing ratio of $m/n$. When the numbers m and n are selected to suitable integers, the frequency dividing ratio $m/n$ can be any desired rational number, and such a procedure does not require any complicated frequency divider. The waveform is arbitrarily predetermined by provision of a waveform memory storing a desired waveform.

Accordingly, the tone-color waveform obtained by using the frequency dividing circuit according to the present invention in the tone-color waveform generating circuit can be of a sensation far closer to that of a natural sound than those obtained from the conventional frequency dividing circuit, and furthermore, the frequency can be easily selected as desired.

According to the present invention, memorizing and reading out of a waveform are achieved through the combination of a ring-counter 3 and a waveform memory 4, whereby the output waveform can be easily varied as desired by simply replacing the waveform memories storing respectively desired waveforms. Thus, the circuit affords not only the above described advantageous features but also division of the frequency of an arbitrary waveform with an arbitrary frequency dividing ratio.

Although the invention has been described with respect to an example where the input signal is a sinusoidal wave, the invention is not restricted thereto, and an input signal of a triangular waveform or a rectangular waveform may also be utilized for obtaining the same advantageous effect. Furthermore, the waveform memorized in the waveform memory 4 may also be triangular, sinusoidal, or of any other suitable shape, and by so selecting, a sinusoidal wave may be frequency-divided to obtain a triangular wave and vice versa, or a rectangular wave may be frequency-divided to obtain a sinusoidal wave.

In the frequency dividing circuit according to the present invention, any possibility of causing errors in the operation of the phase difference detector 15 is eliminated by providing 178 -frequency dividers 14 and 20 for the input signal to the terminal IN and the output signal from the ring-counter 3, respectively. If the ½-frequency dividers 14 and 20 were omitted, duty factors for the two inputs to the detector 15 might be different from each other when the frequency dividing ratios of the $1/m$-frequency divider 13 and the $1/n$-frequency divider 19 are both odd numbers, thus causing the detection of complete equalizing of the frequencies in the phase-difference detector 15 to be entirely impossible. In the case where the frequency dividing ratios of the $1/m$-frequency divider 13 and the $1/n$-frequency divider 19 are even numbers, there is no possibility of errors being caused in the operation of the phase-difference detector 15, and hence the ½-frequency dividers 14 and 20 may be omitted without impairing the above described advantageous effect.

What I claim is:

1. A frequency dividing circuit comprising a waveform memory memorizing a waveform, a voltage controlled oscillator, a counter connected to said voltage controlled oscillator to be driven thereby and connected to said waveform memory for reading out the memorized waveform, an input terminal for receiving an input signal, a $1/n$-frequency divider connected to said counter for dividing the frequency of an output from said counter into $1/n$, a $1/m$-frequency divider connected to said input terminal for dividing the frequency of the input signal into $1/m$, and a phase difference delector connected to said both frequency dividers for receiving the both frequency divided signals and connected to said voltage controlled oscillator for delivering an output voltage whenever a phase difference exists between the outputs from said $1/m$ and $1/n$-frequency dividers, the oscillation frequency of said voltage-controlled oscillator being varied in accordance with the output voltage from said phase difference detector until there exists no difference, whereby the waveform memorized in said waveform memory is successively read out at a repetition frequency equal to an $n/m$ times the frequency of the input signal.

2. A frequency dividing circuit as set forth in claim 1 wherein a ½-frequency divider is further provided between said $1/m$-frequency divider and said phase difference detector, while another ½-frequency divider is provided between said $1/n$-frequency divider and said phase difference detector.

3. A frequency dividing circuit as set forth in claim 1 wherein said counter is a ring-counter, a required number of stages thereof being connected with corresponding terminals of said waveform memory, whereby a waveform memorized in the waveform memory can be read out in a sampled manner when pulses from the ring-counter are sequentially applied to the waveform memory.

* * * * *